(12) United States Patent
Tang

(10) Patent No.: US 8,270,164 B2
(45) Date of Patent: Sep. 18, 2012

(54) LIQUID COOLING SYSTEM AND ELECTRONIC DEVICE INCORPORATING THE SAME

(75) Inventor: Xian-Xiu Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 220 days.

(21) Appl. No.: 12/869,782

(22) Filed: Aug. 27, 2010

(65) Prior Publication Data

US 2011/0317365 A1    Dec. 29, 2011

(51) Int. Cl.
*H05K 7/20* (2006.01)
(52) U.S. Cl. ............. 361/699; 361/679.46; 361/679.53; 361/700; 361/701; 361/702; 165/80.4; 165/80.5; 165/104.33; 165/163; 165/185

(58) Field of Classification Search ............. 361/679.46, 361/679.47, 679.48, 679.53, 698–701, 715, 361/722–728; 165/104.33, 80.4, 185, 80.5, 165/163; 62/259.2
See application file for complete search history.

(56) References Cited

U.S. PATENT DOCUMENTS 6,856,509 B2 *   2/2005   Lin ......................... 361/679.02
* cited by examiner

*Primary Examiner* — Michail V Datskovskiy
(74) *Attorney, Agent, or Firm* — Altis Law Group, Inc.

(57) ABSTRACT

A liquid cooling system includes a heat conductive member, a liquid tank, and plural conduits connecting the heat conductive member with the liquid tank. The heat conductive member is configured for thermally connecting to a heat-generating electronic component. The liquid tank defines a liquid injection hole therein. A clip assembly is connected to the liquid tank. When pressed against the clip assembly by a user, the liquid tank is fastened by the clip assembly and thus retained in position. When pressed again toward the clip assembly, the liquid tank is released from the clip assembly and ejected in a direction away from the heat-generating electronic component. An electronic device using the liquid cooling system is also provided.

19 Claims, 6 Drawing Sheets

_US 8,270,164 B2_

LIQUID COOLING SYSTEM AND ELECTRONIC DEVICE INCORPORATING THE SAME

BACKGROUND

1. Technical Field

The disclosure generally relates to device cooling, and particularly to a liquid cooling system and electronic device incorporating the liquid cooling system.

2. Description of Related Art

It is well known that heat is generated by many kinds of electronic components, such as integrated circuit chips, during their operation. If the heat is not efficiently removed, the electronic components may suffer damage. Thus, liquid cooling systems are often used to cool the electronic components.

A commonly used liquid cooling system generally includes a liquid tank and a working liquid received in the liquid tank. Over the course of time, the amount of working liquid is gradually reduced due to evaporation. To replenish the working liquid, the electronic device incorporating the liquid cooling system is required to be shut down, to prevent damage of electronic components in the electronic device which may occur due to spilled or dropped liquid. The liquid cooling system may even be required to be disassembled from the electronic device. Time is wasted, and the necessary operations are rather complicated.

What is needed, therefore, is a liquid cooling system and an electronic device incorporating the liquid cooling system which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
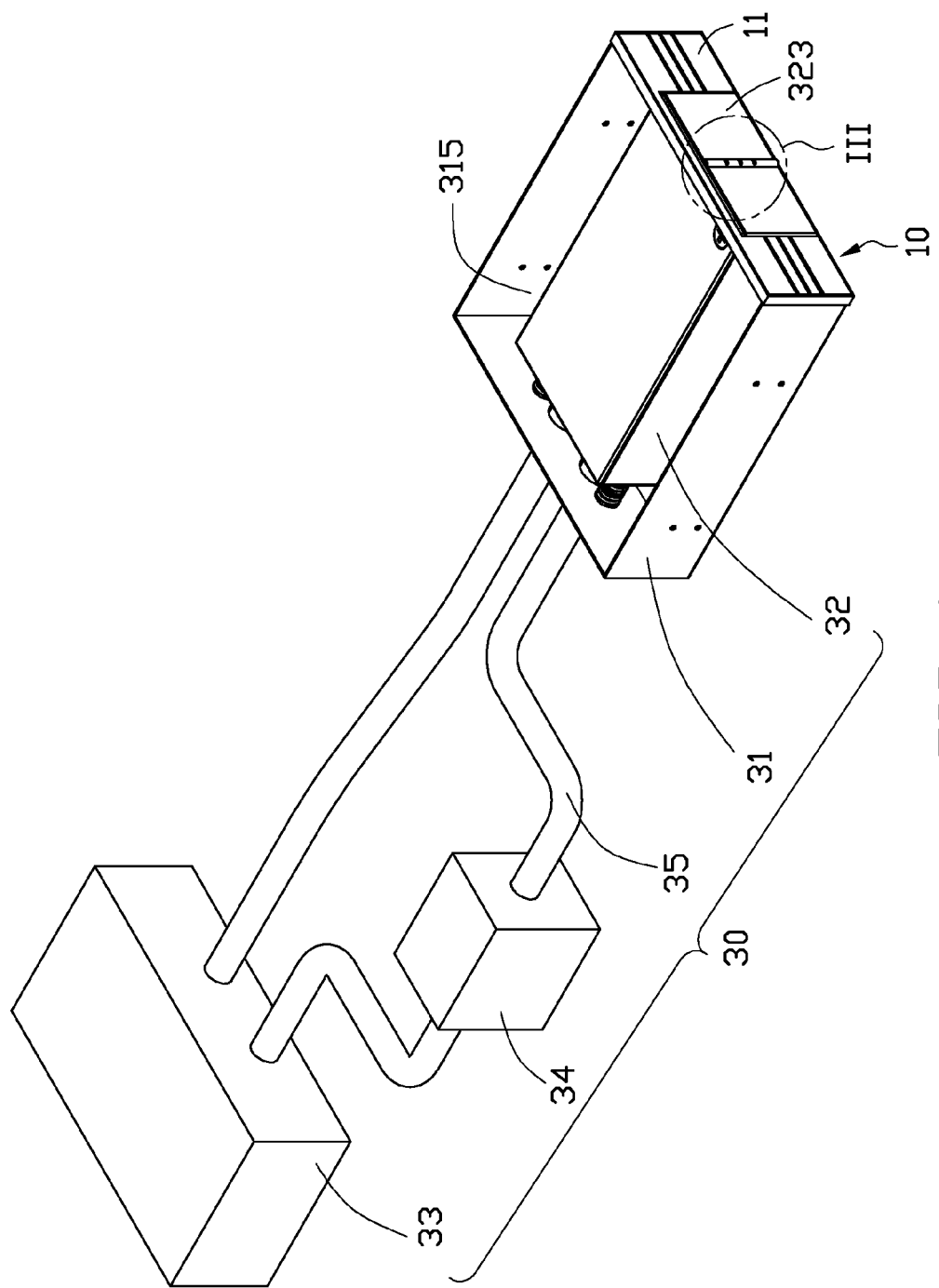
FIG. 1 is an assembled, isometric view of an electronic device in accordance with one embodiment of the disclosure.

Referring to FIG. 1, an electronic device in accordance with one embodiment of the disclosure is shown. The electronic device can be a computer, a server or other device. The electronic device includes a system enclosure 10, and a liquid cooling system 30 received in the enclosure 10. In this description, all orientations and directional relationships mentioned are based on the components as viewed in FIG. 1.

In this embodiment, only a part of a side plate 11 of the enclosure 10 is shown. The side plate 11 defines a rectangular opening 111 (shown in FIG. 2) therein.

The liquid cooling system 30 dissipates heat generated by a heat-generating electronic component (not shown), such as a central processing unit (CPU) or other component, in the enclosure 10. The liquid cooling system 30 includes a fixing member 31, a liquid tank 32 arranged on the fixing member 31, a heat conductive member 33, a liquid pump 34, and a plurality of conduits 35 in communication with the liquid tank 32, the heat conductive member 33 and the liquid pump 34.

Figure 2:
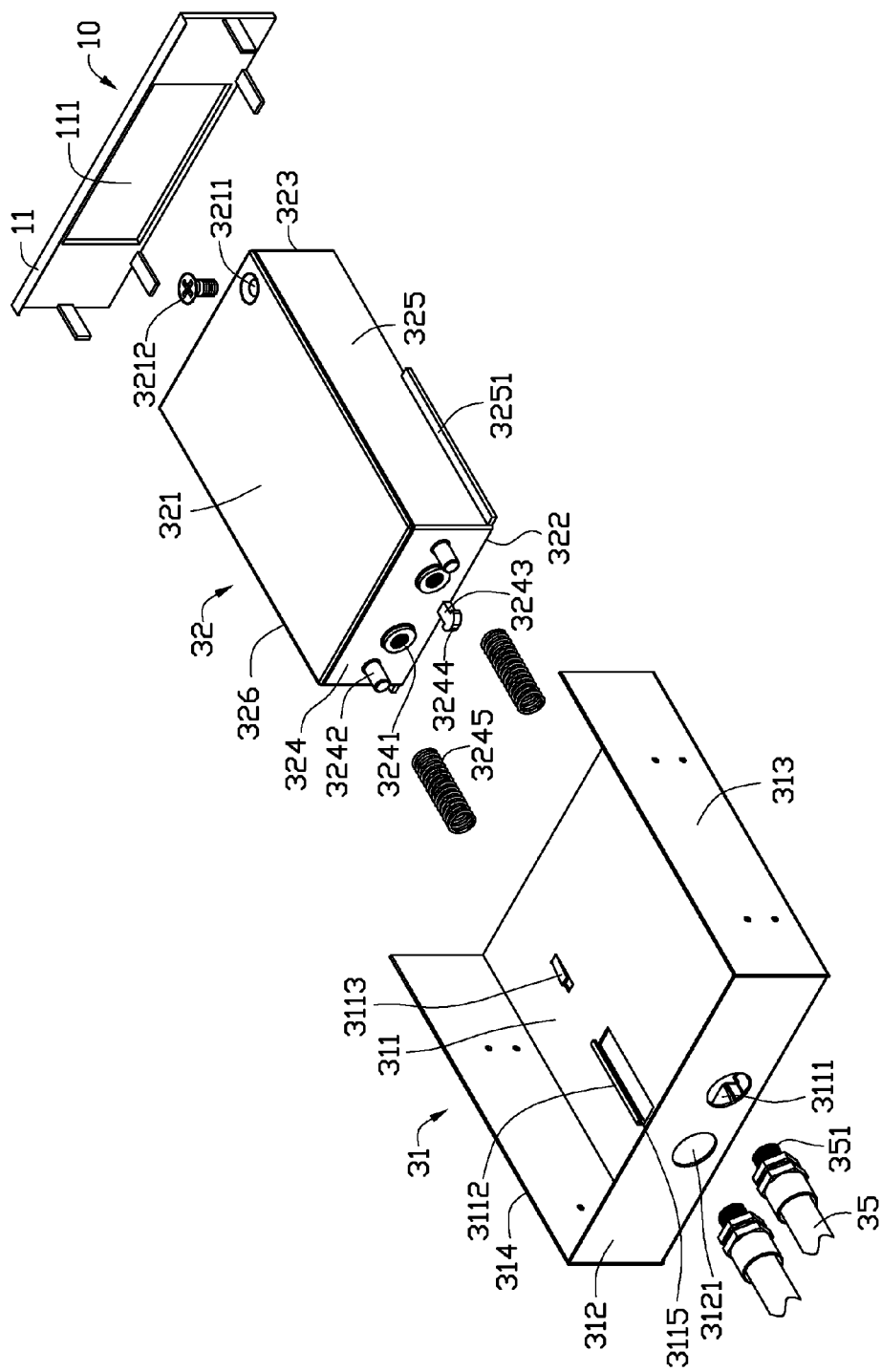
FIG. 2 is an enlarged, exploded view of part of the electronic device shown in FIG. 1.
Figure 3:
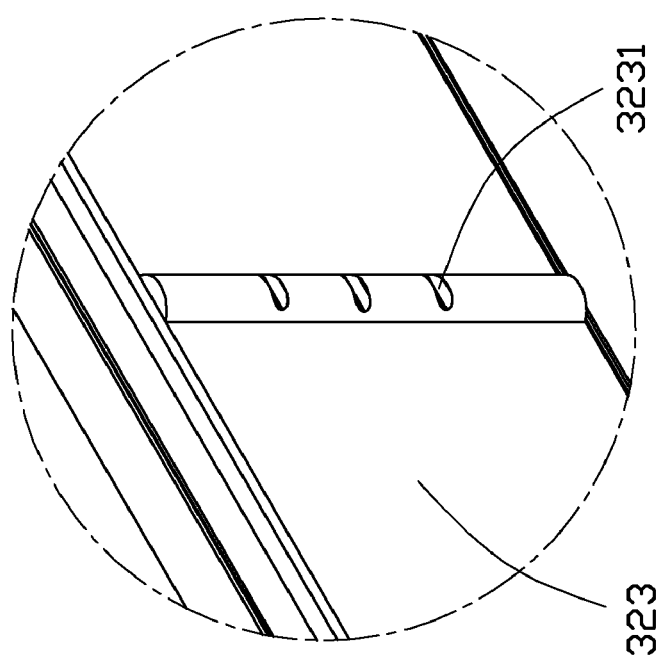
FIG. 3 is an enlarged view of a circled portion III of the electronic device shown in FIG. 1.
Figure 4:
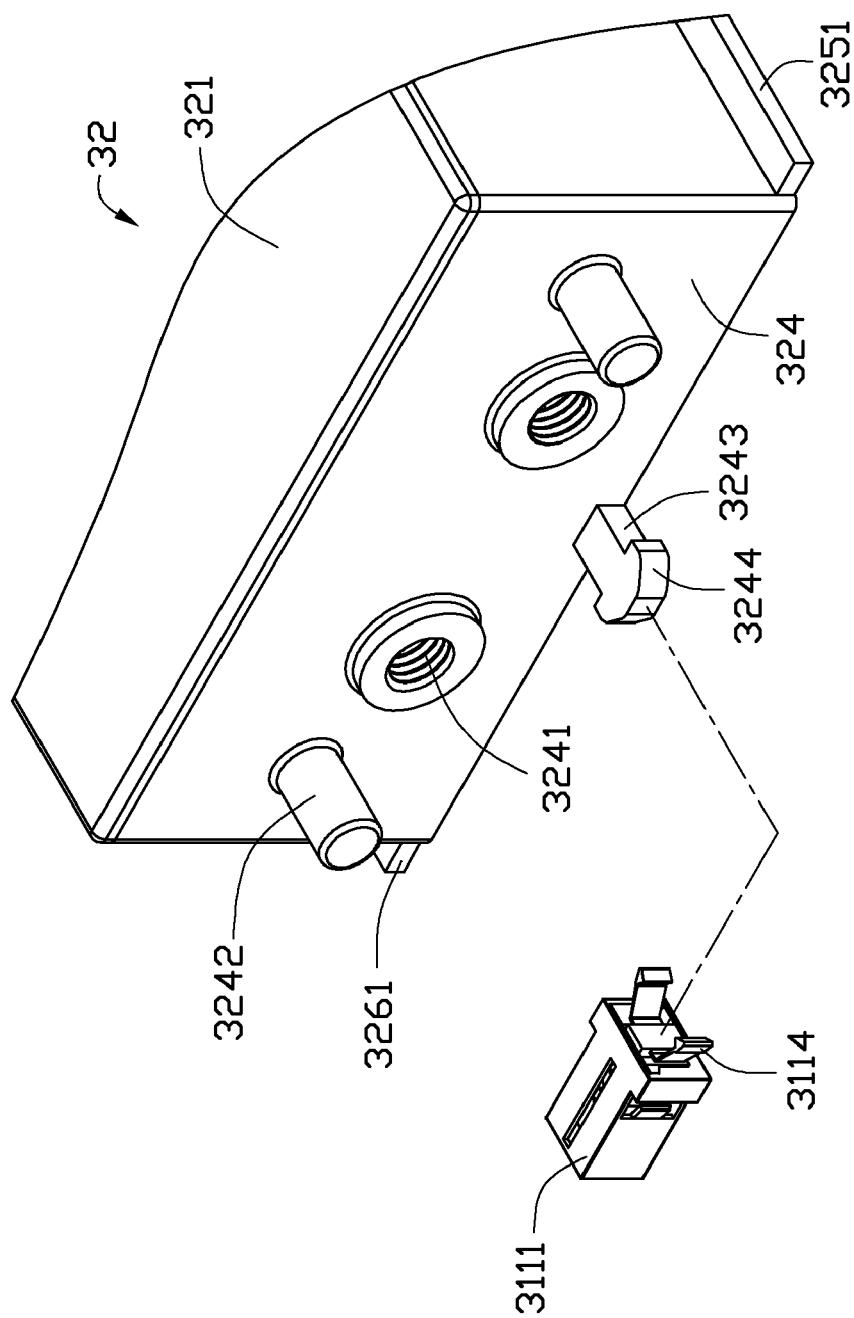
FIG. 4 is an enlarged view of part of a liquid tank and a door lock of the electronic device shown in FIG. 2.

Referring also to FIGS. 2 to 4, the fixing member 31 is fixed on the side plate 11 of the enclosure 10. In this embodiment, the fixing member 31 is an optical disk driver (ODD) fixing structure. The fixing member 31 includes a square base plate 311, and a rear side plate 312, a left side plate 313 and a right side plate 314 extending perpendicularly from the base plate 311.

The rear, left and right side plates 312, 313, 314 have one-to-one correspondence relationships with respect to rear, left and right lateral sides of the base plate 311. The side plate 11 of the enclosure 10 is disposed at a front lateral side of the base plate 311. The rear side plate 312 faces and is parallel to the side plate 11 of the enclosure 10. The rear side plate 312 defines two through holes 3121 through which the conduits 35 extend, respectively. The left and right side plates 313, 314 are located between the rear side plate 312 and the side plate 11 of the enclosure 10. The rear, left and right side plates 312, 313, 314, the side plate 11 of the enclosure 10, and the base plate 311 cooperatively define a receiving space 315 (shown in FIG. 1) therebetween for receiving the liquid tank 32 therein.

The base plate 311 forms a door lock 3111, two fixing flanges 3112 and two stoppers 3113 thereon. The door lock 3111 abuts against the rear plate 312 at a rear end thereof, and includes two hooks 3114 at a front end thereof. The door lock 3111 is a conventional door lock. The door lock 3111 is capable of fastening and ejecting the liquid tank 32 via pressure applied by a user. The fixing flanges 3112 and the stoppers 3113 are located at a middle portion of the base plate 311, and are punched up from the base plate 311. The fixing flanges 3112 are symmetrically disposed at opposite sides of the liquid tank 32, respectively. Each of the fixing flanges 3112 has an inverted L-shaped cross section. A sliding groove 3115 is defined between each fixing flange 3112 and the base plate 311. The sliding grooves 3115 face each other. The stoppers 3113 are also symmetrically disposed at the opposite sides of the liquid tank 32, respectively. The stoppers 3113 align with the sliding grooves 3115, respectively. Each of the stoppers 3113 is laminar. One end of each stopper 3113 furthest from the corresponding fixing flange 3112 extends from the base plate 311, with the stopper 3113 extending obliquely upwardly generally toward the fixing flange 3112.

The liquid tank 32 is hollow and generally rectangular, and contains a working liquid (not shown) therein. The working liquid usually selected is water, methanol, or alcohol, which has a low boiling point. The liquid tank 32 includes a top surface 321, a bottom surface 322, and a front sidewall 323, a rear sidewall 324, a left sidewall 325, and a right sidewall 326 interconnecting the top and bottom surfaces 321, 322. The top surface 321, the bottom surface 322 and the sidewalls 323, 324, 325, 326 are rectangular.

The top surface 321 defines a liquid injection hole 3211 in a front end thereof, adjacent to the side plate 11 of the enclosure 10. A seal 3212 is provided to seal the liquid injection hole 3211. In this embodiment, the liquid injection hole 3211 is a threaded hole, and the seal 3212 a threaded fastener. Alternatively, the liquid injection hole 3211 can be a non-threaded hole, and the seal 3212 can be rubber. The working liquid is injected into the liquid tank 32 from the liquid injection hole 3211.

The front sidewall 323 is located adjacent to the side plate 11 of the enclosure 10, and connects with front lateral sides of the top and bottom surfaces 321, 322. The rear sidewall 324 is disposed away from the side plate 11 of the enclosure 10, and connects with rear lateral sides of the top and bottom surfaces 321, 322. The left and right sidewalls 324 are located between the front and rear sidewalls 323, 324, and connect with corresponding left and right lateral sides of the top and bottom surfaces 321, 322, respectively.

The front sidewall 323 bears a plurality of transparent markings 3231 thereon, for indicating a level of the working liquid contained in the liquid tank 32. A width of the front sidewall 323, namely, a width of the liquid tank 32, is less than a width of the opening 111 of the side plate 11 of the enclosure 10.

The rear sidewall 324 includes two connecting holes 3241 defined therein, and two posts 3242 and an ear 3243 extending out therefrom. The connecting holes 3241 and the posts 3242 align with each other. The posts 3242 are located at opposite ends of the rear sidewall 324, respectively. The connecting holes 3241 are located between the posts 3242, and align with the through holes 3121 of the rear plate 312 of the fixing member 31, respectively. In this embodiment, the connecting holes 3241 are threaded holes. The ear 3243 extends toward the door lock 3111 of the fixing member 31 from a position of the rear plate 324 between the connecting holes 3241 and adjacent to the bottom surface 322. The ear 3243 includes a barb 3244 extending out from a free end thereof. The barb 3244 can be fastened on the hooks 3114 of the door lock 3111. A spring 3245 is disposed around each of the posts 3242. The spring 3245 in a relaxed state is longer than each post 3242. Alternatively, the spring 3245 can be another kind of elastic member between the rear sidewall 324 of the liquid tank 32 and the rear plate 312 of the fixing member 31, such as an elastic tab, or other elastic member.

A distance between the left and right sidewalls 325, 326 of the liquid tank 32, namely, a width of the liquid tank 32, is less than a width of the fixing member 31. Each of the left and right sidewalls 325, 326, namely, a length of the liquid tank 32, is longer than the fixing member 31. Each of the left and right sidewalls 325, 326 includes a positioning flange 3251, 3261 extending perpendicularly from part of a bottom lateral side thereof adjacent to the bottom surface 322 and the rear sidewall 324. The positioning flanges 3251, 3261 are elongated and movably received in the sliding grooves 3115 of the fixing member 31, respectively.

Referring back to FIG. 1, the heat conductive member 33 is made of metal or metal alloy with a high heat conductivity coefficient, such as copper, copper-alloy, or other suitable material. The heat conductive member 33 is hollow. The working liquid contained in the liquid tank 32 enters the heat conductive member 33 via the conduits 35. The heat conductive member 33 thermally contacts the heat-generating electronic component in the enclosure 10, transferring the heat generated by the heat-generating electronic component to the working liquid in the heat conductive member 33.

The liquid pump 34 circulates the working liquid in the liquid tank 32 and the heat conductive member 33, thereby enhancing the heat dissipation efficiency of the liquid cooling system.

The conduits 35 are flexible. Ends of the conduits 35 connecting with the liquid tank 32 each have a bolt 351 provided thereat. In one alternative embodiment, the conduits 35 can be telescopic. In such case, the conduits 35 are extendable and retractable according to movement of the liquid tank 32.

Figure 5:
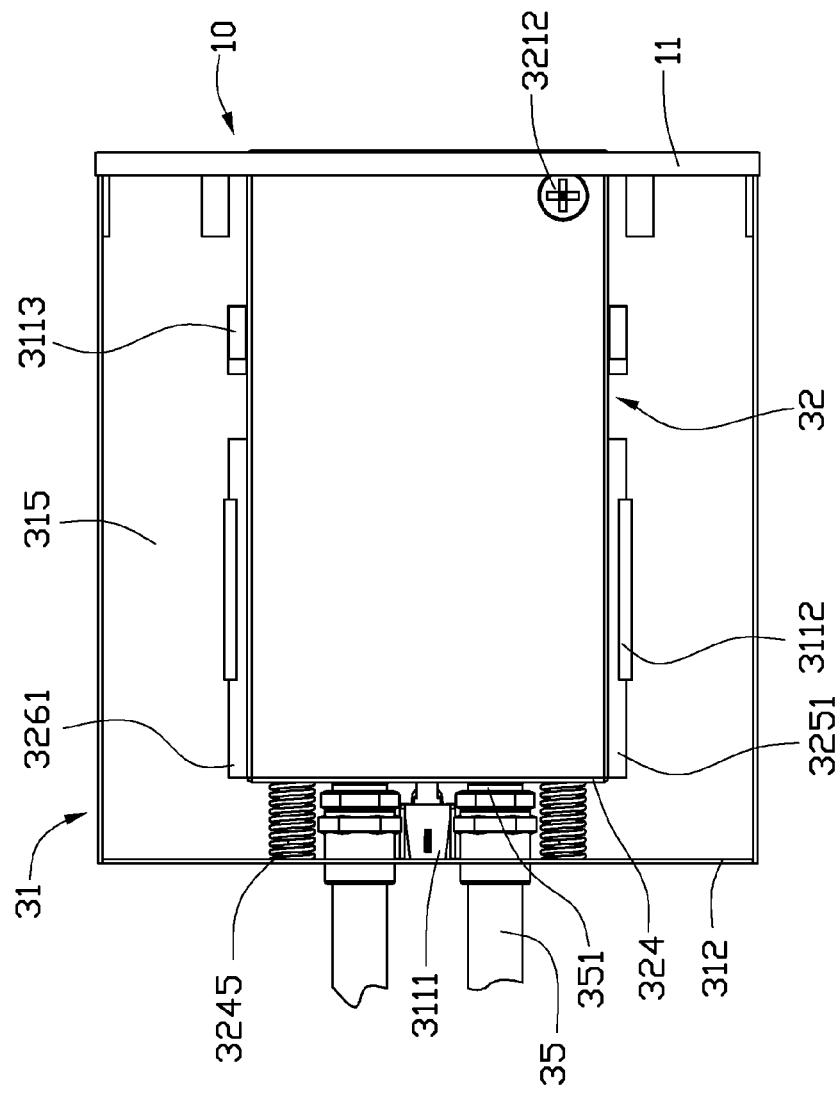
FIG. 5 is a top plan view of part of the electronic device shown in FIG. 1.

Referring to FIGS. 1 and 5, during assembly of the electronic device, the liquid tank 32 is slid into the receiving space 315 from one end of the fixing member 31 adjacent to the side plate 11 of the enclosure 10. The bolts 351 of the conduits 35 extend through the through holes 3121 of the fixing member 31, and are threaded in the connecting holes 3241 of the liquid tank 32, respectively. The ear 3243 of the liquid tank 32 is mounted in the door lock 3111 of the fixing member 31. At this time, the positioning flanges 3251, 3261 of the liquid tank 32 are movably received in the sliding grooves 3115 of the fixing member 31, respectively. The springs 3245 disposed around the posts 3242 of the liquid tank 32 are compressed between the rear sidewall 324 of the liquid tank 32 and the rear plate 312 of the fixing member 31. The fixing member 31 is fixed on the side plate 11 of the enclosure 10. At this time, the front sidewall 323 of the liquid tank 32 is received in the opening 111 of the side plate 11 of the enclosure 10, and is exposed at an exterior of the enclosure 10. The front sidewall 323 is coplanar with the side plate 11.

Figure 6:
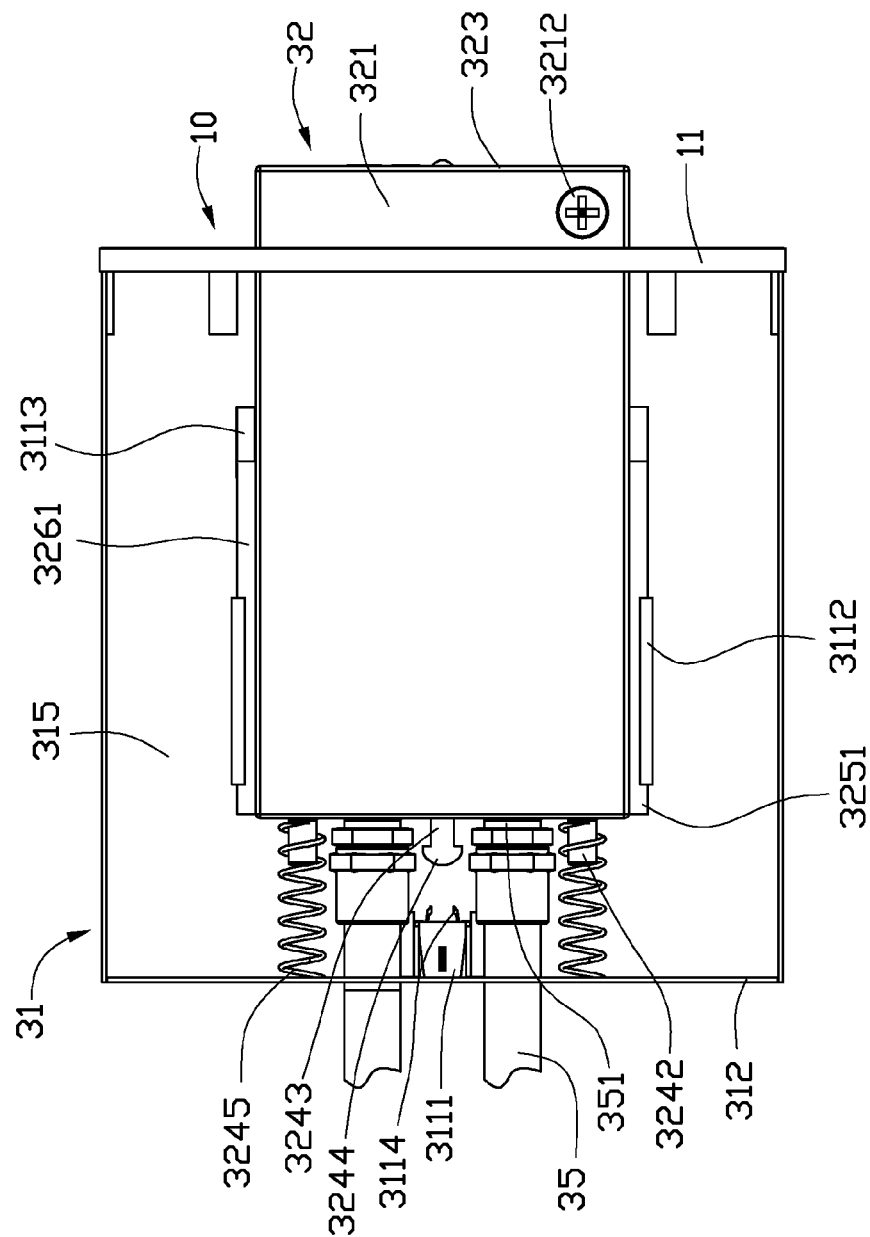
FIG. 6 is similar to FIG. 5, but shows a liquid tank partly ejected from an enclosure of the electronic device.

Referring to FIG. 6, when the prepared working liquid is to be added into the liquid tank 32, the front sidewall 323 of the liquid tank 32 is pressed by a user toward the door lock 3111, and the liquid tank 32 is ejected toward the exterior of the enclosure 10 under the elastic force of the door lock 3111 and the springs 3245. The positioning flanges 3251, 3261 of the liquid tank 32 slide in the sliding grooves 3115 of the fixing member 31, until the positioning flanges 3251, 3261 abut against the stoppers 3113 of the fixing member 31, respectively. At this time, a front end of the liquid tank 32 with the front sidewall 323 and the liquid injection hole 3211 is ejected of the enclosure 10. The seal 3212 is removed from the liquid injection hole 3211, and the prepared working liquid is injected into the liquid tank 32 through the liquid injection hole 3211. After the working liquid is injected into the liquid tank 32, the seal 3212 is resealed in the liquid injection hole 3211. The front sidewall 323 of the liquid tank 32 is pressed again toward the door lock 3111, and the ear 3243 of the liquid tank 32 is fastened by the door lock 3111. Thus the liquid tank 32 returns to its original position.

In the electronic device and the liquid cooling system 30 thereof, the door lock 3111 of the fixing member 31, and the ear 3243 and the springs 3245 of the liquid tank 32, cooperatively form a clip assembly maintaining the liquid tank 32 in the enclosure 10 or ejecting the liquid tank 32 from the enclosure 10. When the liquid tank 32 is pressed against the clip assembly, the liquid tank 32 is fastened by the clip assembly and thus retained in position in the enclosure 10. When the liquid tank 32 is pressed again toward the clip assembly, the liquid tank 32 is released from the clip assembly and thus ejected. Therefore when working liquid is required to be injected into the liquid tank 32, the liquid injection hole 3211 of the liquid tank 32 can be ejected from the enclosure 10 and the liquid tank 32 can simultaneously be moved away from the heat-generating electronic component by the pressing of the liquid tank 32 toward the clip assembly.

With this mechanism, not only can the working liquid be conveniently added into the liquid tank 32, but also the working liquid can be prevented from dropping onto and damaging the heat-generating electronic component. Thus, when the working liquid is replenished, the electronic device need not be shut down, and the liquid cooling system 30 need not be disassembled from the electronic device. This simplifies the maintenance and operation of the liquid cooling system 30. In addition, the front sidewall 323 of the liquid tank 32 has the transparent markings 3231 formed thereon. The transparent markings 3231 are exposed to the outside of the enclosure 10, and show the level of working liquid contained in the liquid tank 32. As a result, the working liquid can be added into the liquid tank 32 in a timely manner. This enhances the heat dissipation efficiency and reliability of the liquid cooling system 30.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system comprising:
    a heat conductive member configured for thermally connecting to a heat-generating electronic component;
    a liquid tank defining a liquid injection hole therein;
    a plurality of conduits connecting the heat conductive member with the liquid tank; and
    a clip assembly connected to the liquid tank, whereby when the liquid tank is pressed against the clip assembly by a user, the liquid tank is fastened by the clip assembly and thus retained in position, and when the liquid tank is pressed again toward the clip assembly, the liquid tank is released from the clip assembly and ejected in a direction away from the heat-generating electronic component,
    wherein the clip assembly comprises a door lock, an ear and an elastic member, wherein when the door lock receives the ear, the liquid tank is retained by the elastic member, and when the door lock is released from the ear, the liquid tank is ejected by the elastic member.

2. The liquid cooling system of claim 1, further comprising a fixing member on which the liquid tank is located, wherein the door lock is formed on the fixing member, the ear is formed on the liquid tank, and the elastic member is disposed between the fixing member and the liquid tank.

3. The liquid cooling system of claim 2, wherein the fixing member is an optical disk driver fixing structure.

4. The liquid cooling system of claim 2, wherein the liquid tank comprises a post formed thereon, the elastic member is a spring disposed around the post, the door lock comprises a hook at one end thereof, the ear comprises a barb at one end thereof, and the barb of the ear is fastened on the hook of the door lock for retaining the liquid tank in place.

5. The liquid cooling system of claim 2, wherein the fixing member comprises a base plate and a side plate extending from the base plate, the liquid tank comprises a top surface, a bottom surface, and a plurality of sidewalls interconnecting the top and bottom surfaces, the spring is disposed between the side plate of the fixing member and one of the sidewalls of the liquid tank, the door lock is formed on the base plate of the fixing member, and the liquid injection hole is defined in the top surface of the liquid tank.

6. The liquid cooling system of claim 2, wherein the fixing member comprises a base plate and a side plate extending from the base plate, the base plate comprises a fixing flange formed thereon, disposed at an outer periphery of the liquid tank, a sliding groove is defined between the fixing flange and the base plate, the liquid tank comprises a top surface, a bottom surface, and a plurality of sidewalls interconnecting the top and bottom surfaces, one of the sidewalls comprises a positioning flange extending therefrom, and the positioning flange is movably received in the sliding groove of the fixing member.

7. The liquid cooling system of claim 6, wherein the base plate of the fixing member further comprises a stopper away from the clip assembly, and the stopper is disposed at the outer periphery of the liquid tank, and aligns with the sliding groove.

8. The liquid cooling system of claim 7, wherein the stopper is laminar, and is punched from the base plate of the fixing member, one end of the stopper furthest from the corresponding fixing flange extends from the base plate, with the stopper extending obliquely upwardly generally toward the fixing flange.

9. The liquid cooling system of claim 1, wherein the liquid tank further comprises a plurality of markings formed thereon, configured for showing a level of a working liquid contained in the liquid tank.

10. The liquid cooling system of claim 1, wherein the conduits are flexible or telescopic.

11. An electronic device comprising:
    an enclosure; and
    a liquid cooling system comprising:
        a heat conductive member configured for thermally connecting to a heat-generating electronic component in the enclosure;
        a liquid tank defining a liquid injection hole therein, the liquid tank located in the enclosure;
        conduits connecting the heat conductive member with the liquid tank; and
        a clip assembly connected to the liquid tank, wherein when the liquid tank is pressed against the clip assembly, the liquid tank is fastened by the clip assembly and thus retained, and when the liquid tank is pressed again toward the clip assembly, the liquid tank is released from the clip assembly and thus a portion of the liquid tank with the liquid injection hole is ejected of the enclosure,
    wherein the clip assembly comprises a door lock, an ear and an elastic member, whereby when the door lock receives the ear, the liquid tank is retained by the elastic member, and when the door lock is released from the ear, the liquid tank is ejected by the elastic member.

12. The electronic device of claim 11, wherein the liquid cooling system further comprises a fixing member on which the liquid tank is located, the door lock is formed on the fixing member, the ear is formed on the liquid tank, and the elastic member is disposed between the fixing member and the liquid tank.

13. The electronic device of claim 12, wherein the liquid tank comprises a post formed thereon, the elastic member is a spring disposed around the post, the door lock comprises a hook at one end thereof, the ear comprises a barb at one end thereof, and the barb of the ear is fastened on the hook of the door lock for retaining the liquid tank in place.

14. The electronic device of claim 12, wherein the fixing member comprises a base plate and a side plate extending from the base plate, the liquid tank comprises a top surface, a bottom surface, and a plurality of sidewalls interconnecting the top and bottom surfaces, the spring is disposed between the side plate of the fixing member and one of the sidewalls of the liquid tank, the door lock is formed on the base plate of the fixing member, and the liquid injection hole is defined in the top surface of the liquid tank.

15. The electronic device of claim 12, wherein the fixing member comprises a base plate and a side plate extending from the base plate, the base plate comprises a fixing flange and a stopper formed thereon, the fixing flange and the stopper is disposed at an outer periphery of the liquid tank, a sliding groove is defined between the fixing flange and the base plate, the stopper aligns with the sliding groove, the liquid tank comprises a top surface, a bottom surface, and a plurality of sidewalls interconnecting the top and bottom surfaces, one of the sidewalls comprises an positioning flange extending therefrom, the positioning flange is movably received in the sliding groove of the fixing member, and the stopper is capable of blocking the positioning flange.

16. The electronic device of claim 11, wherein the enclosure comprises a side plate defining an opening therein, the liquid tank comprises a top surface, a bottom surface, and a plurality of sidewalls interconnecting the top and bottom surfaces, and one of the sidewalls is received in the opening of the side plate of the enclosure and exposed to an exterior of the enclosure.

17. The electronic device of claim 16, wherein the liquid injection hole is defined in one end of the top surface of the liquid tank adjacent to the side plate of the enclosure, a seal is provided to seal the liquid injection hole, and when the liquid tank is released from the clip assembly, the end of the liquid tank with the liquid injection hole is ejected from the enclosure from the opening.

18. The electronic device of claim 16, wherein the sidewall the liquid tank received in the opening further comprises a plurality of markings formed thereon, configured for showing a level of a working liquid contained in the liquid tank, the markings exposed to the exterior of the enclosure.

19. An electronic device comprising:
an enclosure; and
a liquid cooling system comprising:

a heat conductive member configured for thermally connecting to a heat-generating electronic component in the enclosure;
    a liquid tank defining a liquid injection hole therein, the liquid tank located in the enclosure;
    conduits connecting the heat conductive member with the liquid tank;
a clip assembly connected to the liquid tank, wherein when the liquid tank is pressed against the clip assembly, the liquid tank is fastened by the clip assembly and thus retained, and when the liquid tank is pressed again toward the clip assembly, the liquid tank is released from the clip assembly and thus a portion of the liquid tank with the liquid injection hole is ejected of the enclosure;
wherein the enclosure comprises a side plate defining an opening therein, the liquid tank comprises a top surface, a bottom surface, and a plurality of sidewalls interconnecting the top and bottom surfaces, and one of the sidewalls is received in the opening of the side plate of the enclosure and exposed to an exterior of the enclosure; and
wherein the sidewall the liquid tank received in the opening further comprises a plurality of markings formed thereon, configured for showing a level of a working liquid contained in the liquid tank, the markings exposed to the exterior of the enclosure.

\* \* \* \* \*